(12) United States Patent
Zhao et al.

(10) Patent No.: US 11,575,271 B2
(45) Date of Patent: Feb. 7, 2023

(54) SOC AND SOH ESTIMATION METHODS OF BATTERY PACK

(71) Applicant: CALB Co., Ltd., Jiangsu (CN)

(72) Inventors: Yu Zhao, Luoyang (CN); Lei Wang, Luoyang (CN)

(73) Assignee: CALB Co., Ltd., Jiangsu (CN)

( * ) Notice: Subject to any disclaimer, the term of this patent is extended or adjusted under 35 U.S.C. 154(b) by 286 days.

(21) Appl. No.: 17/012,041

(22) Filed: Sep. 3, 2020

(65) Prior Publication Data
US 2021/0194260 A1 Jun. 24, 2021

(30) Foreign Application Priority Data
Dec. 24, 2019 (CN) .......................... 201911349422.9

(51) Int. Cl.
*H02J 7/00* (2006.01)
*G01R 31/392* (2019.01)
(Continued)

(52) U.S. Cl.
CPC .......... *H02J 7/0048* (2020.01); *G01R 31/367* (2019.01); *G01R 31/388* (2019.01);
(Continued)

(58) Field of Classification Search
CPC ...... H02J 7/0048; H02J 7/005; H02J 7/00712; G01R 31/367; G01R 31/388; G01R 31/392; G01R 31/3835
See application file for complete search history.

(56) References Cited

U.S. PATENT DOCUMENTS 6,366,054 B1 * 4/2002 Hoenig ................ G01R 31/388
320/132
2009/0027056 A1 * 1/2009 Huang ................ G01R 31/392
320/132
(Continued)

FOREIGN PATENT DOCUMENTS

CN 103529396 1/2014
CN 104076283 10/2014
(Continued)

OTHER PUBLICATIONS

"Search Report of Europe Counterpart Application", dated Mar. 2, 2021, pp. 1-7.
(Continued)

Primary Examiner — Stacy Whitmore
(74) Attorney, Agent, or Firm — JCIP Global Inc.

(57) ABSTRACT

The disclosure provides state-of-charge (SOC) and state-of-health (SOH) estimation methods of a battery pack. The SOC estimation method of the battery pack includes the following steps. First, a current resting time, a current battery temperature, and a current measured open circuit voltage corresponding to a current initial power-on time of the battery pack are obtained. Next, an SOC value corresponding to the current initial power-on time is determined according to the obtained current resting time, current battery temperature, current measured open circuit voltage, and a relational expression between an open circuit voltage, a resting time, a battery temperature, and an SOC value at predetermined different battery temperatures, so that the battery pack can be characterized according to the obtained SOC value.

13 Claims, 6 Drawing Sheets

(51) Int. Cl.
*G01R 31/388* (2019.01)
*G01R 31/367* (2019.01)

(52) U.S. Cl.
CPC ............ *G01R 31/392* (2019.01); *H02J 7/005* (2020.01); *H02J 7/00712* (2020.01)

(56) References Cited

U.S. PATENT DOCUMENTS

| | | | | |
|---|---|---|---|---|
| 2011/0316548 | A1* | 12/2011 | Ghantous | H02J 7/0048 324/427 |
| 2012/0265397 | A1* | 10/2012 | Aliberti | B60L 58/10 702/63 |
| 2014/0232411 | A1* | 8/2014 | Vaidya | G01R 31/3842 324/426 |
| 2015/0280290 | A1* | 10/2015 | Saha | H01M 10/425 324/426 |
| 2021/0091421 | A1* | 3/2021 | Yazami | H01M 10/4257 |

FOREIGN PATENT DOCUMENTS

| | | | | |
|---|---|---|---|---|
| CN | 104459551 | | 3/2015 | |
| CN | 106483468 | | 3/2017 | |
| CN | 106597287 | | 4/2017 | |
| CN | 108549032 | | 9/2018 | |
| CN | 108693473 | | 10/2018 | |
| CN | 108717164 | | 10/2018 | |
| CN | 109239608 | | 1/2019 | |
| CN | 109541473 | | 3/2019 | |
| CN | 110333450 | | 10/2019 | |
| CN | 110333450 A | * | 10/2019 | ........... G01R 31/367 |
| WO | WO-2007048367 A1 | * | 5/2007 | ................ B60L 3/12 |
| WO | WO-2011050924 A1 | * | 5/2011 | .......... B60L 11/1851 |
| WO | WO-2021118311 A1 | * | 6/2021 | ......... G01R 31/3648 |

OTHER PUBLICATIONS

"Office Action of China Counterpart Application" with English translation thereof, dated Aug. 20, 2021, p. 1-p. 8.

* cited by examiner

SOC AND SOH ESTIMATION METHODS OF BATTERY PACK

CROSS-REFERENCE TO RELATED APPLICATION

This application claims the priority benefit of China application serial no. 201911349422.9, filed on Dec. 24, 2019. The entirety of the above-mentioned patent application is hereby incorporated by reference herein and made a part of this specification.

BACKGROUND

Technical Field

The disclosure relates to the technical field of a battery pack, in particular, to state-of-charge (SOC) estimation method of a battery pack and state-of-health (SOH) estimation method of a battery pack.

Description of Related Art

The SOC reflects the remaining capacity of a battery, and the SOH reflects the fact that as the times of use of battery increase, its actual capacity gradually declines. Accurate estimation of the SOC and the SOH is one of the core functions of a battery management system (BMS) and is important for ensuring the safe use of battery and extending the cycle life of battery.

SUMMARY

An embodiment of the disclosure provides SOC and SOH estimation methods of a battery pack adapted for estimating an SOC and an SOH.

An embodiment of the disclosure provides an SOC estimation method of a battery pack including the following steps. A current resting time, a current battery temperature, and a current measured open circuit voltage corresponding to a current initial power-on time of the battery pack are obtained. An SOC value corresponding to the current initial power-on time is determined according to the current resting time, the current battery temperature, the current measured open circuit voltage, and a relational expression between an open circuit voltage, a current resting time, a battery temperature, and an SOC value at predetermined different battery temperatures.

Optionally, in the embodiment of the disclosure, the step of determining the SOC value corresponding to the current initial power-on time includes the following steps. An open circuit voltage closest to the current measured open circuit voltage is determined according to the current resting time, the current battery temperature, and a relational expression of open circuit voltages corresponding to multiple different SOC values at the predetermined different battery temperatures. The SOC value corresponding to the current initial power-on time is determined according to the determined open circuit voltage closest to the current measured open circuit voltage and its corresponding SOC value.

Optionally, in the embodiment of the disclosure, the step of determining the open circuit voltage closest to the current measured open circuit voltage includes the following steps. The open circuit voltages corresponding to the multiple different SOC values at the current battery temperature are determined according to the current resting time, the current battery temperature, and the relational expression of the open circuit voltages corresponding to the multiple different SOC values at the predetermined different battery temperatures. A current maximum value and a current minimum value are determined from among the determined open circuit voltages corresponding to the multiple different SOC values at the current battery temperature, where the current maximum value is a maximum value among the open circuit voltages corresponding to the multiple different SOC values that are less than the current measured open circuit voltage, and the current minimum value is a minimum value among the open circuit voltages corresponding to the multiple different SOC values that are greater than the current measured open circuit voltage. The current maximum value and the current minimum value are determined as the open circuit voltage closest to the current measured open circuit voltage. The step of determining the SOC value corresponding to the current initial power-on time includes the following steps. A linear relational expression is determined according to the current maximum value and its corresponding SOC value, and the current minimum value and its corresponding SOC value. The SOC value corresponding to the current initial power-on time is determined according to the linear relational expression and the current measured open circuit voltage.

Optionally, in the embodiment of the disclosure, a relational expression of an open circuit voltage corresponding to an $m^{th}$ SOC value in the relational expression of the open circuit voltages corresponding to the multiple different SOC values is as follows:

$$OCV(t)_{-m} = a_{-m} \log(t) + b_{-m} t + c_{-m}$$

where $a_{-m}$, $b_{-m}$, and $c_{-m}$ represent constant coefficients, t represents the current resting time, and $OCV(t)_{-m}$ represents the open circuit voltage corresponding to the $m^{th}$ SOC value at the current resting time t.

Optionally, in the embodiment of the disclosure, the step of determining the relational expression of the open circuit voltage corresponding to the $m^{th}$ SOC value includes the following steps. A battery cell sample is selected. Open circuit voltages and SOC values of the battery cell sample are obtained at different battery temperatures within different current resting times of the battery cell sample. The open circuit voltages and the SOC values of the battery cell sample obtained within the different current resting times are fitted by using a least square method to determine the relational expression of the open circuit voltage corresponding to the $m^{th}$ SOC value.

Optionally, in the embodiment of the disclosure, after obtaining the current resting time, the current battery temperature, and the current measured open circuit voltage of the battery pack corresponding to the current initial power-on time, and before determining the open circuit voltages corresponding to the multiple different SOC values at the current battery temperature, the method further includes the following step. It is determined whether the current resting time corresponding to the current initial power-on time is greater than a current resting time feature value. The step of determining the open circuit voltages corresponding to the multiple different SOC values at the current battery temperature includes the following step. The open circuit voltages corresponding to the multiple different SOC values at the current battery temperature are determined when it is determined that the current resting time corresponding to the current initial power-on time is greater than the current resting time feature value.

Optionally, in the embodiment of the disclosure, the current battery temperature is a minimum value among current battery temperatures corresponding to battery cells in the battery pack.

An embodiment of the disclosure further provides an SOH estimation method of a battery pack including the following steps. A current resting time, a current battery temperature, and a current measured open circuit voltage corresponding to a current initial power-on time of the battery pack are obtained. An SOC value corresponding to the current initial power-on time is determined according to the current resting time, the current battery temperature, the current measured open circuit voltage, and a relational expression between an open circuit voltage, a current resting time, a battery temperature, and an SOC value at predetermined different battery temperatures. The battery pack is controlled to charge starting from the current initial power-on time, and a corresponding actual charge capacity of the battery pack from the current initial power-on time to completion of a current charge, and a corresponding current battery temperature of the battery pack upon completion of the current charge are determined. A maximum charge capacity corresponding to the current battery temperature is determined according to the current battery temperature and a pre-stored correspondence between the battery temperature and the maximum charge capacity of the battery pack upon completion of the current charge. A target SOH value of an SOH of the battery pack is determined according to the actual charge capacity, the maximum charge capacity corresponding to the current battery temperature, and the determined SOC value corresponding to the current initial power-on time.

Optionally, in the embodiment of the disclosure, a relational expression below is adopted to determine the target SOH value of the SOH of the battery pack:

$$SOH_0 = \frac{Ccharge}{Ccor * (100\% - SOC_0)}$$

where $SOH_0$ represents the target SOH value of the SOH of the battery pack, Ccharge represents the actual charge capacity, Ccor represents the maximum charge capacity corresponding to the current battery temperature, and $SOC_0$ represents the determined SOC value corresponding to the current initial power-on time.

Optionally, in the embodiment of the disclosure, after determining the SOC value corresponding to the current initial power-on time, and before controlling the battery pack to charge starting from the current initial power-on time, the method further includes the following step. It is determined whether the SOC value is less than an SOC feature value. The step of controlling the battery pack to charge starting from the current initial power-on time includes the following step. The battery pack is controlled to charge starting from the current initial power-on time when it is determined that the SOC value is less than the SOC feature value.

An embodiment of the disclosure further provides an SOH estimation method of a battery pack including the following steps. A corresponding total charge capacity of the battery pack from completion of a first charge to completion of a current charge is determined, where the total charge capacity is a sum of charge capacities of the battery pack from completion of the first charge to completion of the current charge. A target SOH value of the battery pack is determined according to the total charge capacity and a predetermined capacity change threshold.

Optionally, in the embodiment of the disclosure, the step of determining the target SOH value of the battery pack includes the following steps. A corresponding current SOH value of the battery pack is determined according to a relational expression $$SOH_{00} = \left(100 - \frac{Ctotal}{\Delta C}\right)\%,$$

where $SOH_{00}$ represents the current SOH value, Ctotal represents the total charge capacity, and $\Delta C$ represents the capacity change threshold. The target SOH value of the battery pack is determined according to the determined current SOH value.

Optionally, in the embodiment of the disclosure, the step of determining the target SOH value of the battery pack according to the determined current SOH value includes the following step. By using a moving average filtering method, the corresponding target SOH value of the battery pack upon completion of the current charge after filtering is determined according to the current SOH value.

An embodiment of the disclosure further provides an SOH estimation method of a battery pack including the following steps. A corresponding first SOH value of the battery pack from a current initial power-on time to completion of a current charge is determined. A corresponding total charge capacity of the battery pack from completion of a first charge to completion of the current charge is determined; and a second SOH value of the battery pack is determined according to the total charge capacity and a predetermined capacity change threshold, where the total charge capacity is a sum of charge capacities of the battery pack from completion of the first charge to completion of the current charge. A corresponding target SOH value of the battery pack is determined according to the first SOH value and the second SOH value.

Optionally, in the embodiment of the disclosure, the step of determining the corresponding target SOH value of the battery pack according to the first SOH value and the second SOH value includes the following steps. A first intermediate SOH value of the battery pack is determined according to a relational expression $SOH_{000}=m*SOH_1+n*SOH_2$, where m and n respectively represent weighting factors, m+n=1, $SOH_1$ represents the first SOH value, $SOH_2$ represents the second SOH value, and $SOH_{000}$ represents the first intermediate SOH value. By using a moving average filtering method, the target SOH value after filtering is determined according to the first intermediate SOH value.

Optionally, in the embodiment of the disclosure, the step of determining the corresponding first SOH value of the battery pack from the current initial power-on time to completion of the current charge includes the following steps. A resting time, a current battery temperature, and a current measured open circuit voltage corresponding to the current initial power-on time of the battery pack are determined. An SOC value corresponding to the current initial power-on time is determined according to the resting time, the current battery temperature, the current measured open circuit voltage, and a relational expression between an open circuit voltage, a resting time, a battery temperature, and an SOC value at predetermined different battery temperatures. The battery pack is controlled to charge starting from the current initial power-on time, and a corresponding actual charge capacity of the battery pack from the current initial power-on time to completion of the current charge, and a corresponding current battery temperature of the battery pack upon completion of the current charge are determined. A maximum charge capacity corresponding to the current battery temperature is determined according to the current battery temperature and a pre-stored correspondence between the battery temperature and the maximum charge capacity of the battery pack upon completion of the current charge. The first SOH value is determined according to the actual charge capacity, the maximum charge capacity corresponding to the current battery temperature, and the determined SOC value corresponding to the current initial power-on time.

Optionally, in the embodiment of the disclosure, a relational expression below is adopted to determine the first SOH value:

$$SOH_1 = \frac{Ccharge}{Ccor*(100\% - SOC_0)}$$

where $SOH_1$ represents the first SOH value, Ccharge represents the actual charge capacity, Ccor represents the maximum charge capacity corresponding to the current battery temperature, and $SOC_0$ represents the SOC value corresponding to the current initial power-on time.

Optionally, in the embodiment of the disclosure, after determining the SOC value corresponding to the current initial power-on time, and before controlling the battery pack to charge starting from the current initial power-on time, the method further includes the following step. It is determined whether the SOC value is less than an SOC feature value. The step of controlling the battery pack to charge starting from the current initial power-on time includes the following step. The battery pack is controlled to charge starting from the current initial power-on time when it is determined that the SOC value is less than the SOC feature value.

Optionally, in the embodiment of the disclosure, the step of determining the SOC value corresponding to the current initial power-on time includes the following steps. An open circuit voltage closest to the current measured open circuit voltage is determined according to the resting time, the current battery temperature, and a relational expression of open circuit voltages corresponding to multiple different SOC values at the predetermined different battery temperatures. The SOC value corresponding to the current initial power-on time is determined according to the determined open circuit voltage closest to the current measured open circuit voltage and its corresponding SOC value.

Optionally, in the embodiment of the disclosure, the step of determining the open circuit voltage closest to the current measured open circuit voltage includes the following steps. The open circuit voltages corresponding to the multiple different SOC values at the current battery temperature are determined according to the resting time, the current battery temperature, and the relational expression of the open circuit voltages corresponding to the multiple different SOC values at the predetermined different battery temperatures. A current maximum value and a current minimum value are determined from among the determined open circuit voltages corresponding to the multiple different SOC values at the current battery temperature, where the current maximum value is a maximum value among the open circuit voltages corresponding to the multiple different SOC values that are less than the current measured open circuit voltage, and the current minimum value is a minimum value among the open circuit voltages corresponding to the multiple different SOC values that are greater than the current measured open circuit voltage. The current maximum value and the current minimum value are determined as the open circuit voltage closest to the current measured open circuit voltage. The step of determining the SOC value corresponding to the current initial power-on time includes the following steps. A linear relational expression is determined according to the current maximum value and its corresponding SOC value, and the current minimum value and its corresponding SOC value. The SOC value corresponding to the current initial power-on time is determined according to the linear relational expression and the current measured open circuit voltage.

Optionally, in the embodiment of the disclosure, a relational expression of an open circuit voltage corresponding to an $m^{th}$ SOC value in the relational expression of the open circuit voltages corresponding to the multiple different SOC values is as follows:

$$OCV(t)_{-m} = a_{-m}\log(t) + b_{-m}t + c_{-m}$$

where $a_{-m}$, $b_{-m}$, and $c_{-m}$ represent constant coefficients, t represents the resting time, and $OCV(t)_{-m}$ represents the open circuit voltage corresponding to the $m^{th}$ SOC value at the resting time t.

Optionally, in the embodiment of the disclosure, after determining the resting time, the current battery temperature, and the current measured open circuit voltage of the battery pack corresponding to the current initial power-on time, and before determining the open circuit voltages corresponding to the multiple different SOC values at the current battery temperature, the method further includes the following step. It is determined whether the resting time corresponding to the current initial power-on time is greater than a resting time feature value. The step of determining the open circuit voltages corresponding to the multiple different SOC values at the current battery temperature includes the following step. The open circuit voltages corresponding to the multiple different SOC values at the current battery temperature are determined when it is determined that the resting time corresponding to the current initial power-on time is greater than the resting time feature value.

Optionally, in the embodiment of the disclosure, the step of determining the second SOH value includes the following step. The corresponding second SOH value of the battery pack is determined according to a relational expression $$SOH_2 = \left(100 - \frac{Ctotal}{\Delta C}\right)\%,$$

where $SOH_2$ represents the second SOH value, Ctotal represents the total charge capacity, and $\Delta C$ represents the capacity change threshold.

In summary of the above, in the SOC estimation method of the battery pack provided in the embodiment of the disclosure, the current resting time, the current battery temperature, and the current measured open circuit voltage corresponding to the current initial power-on time of the battery pack are first obtained, and then according to the obtained current resting time, current battery temperature, and current measured open circuit voltage, and the relational expression between the open circuit voltage, the resting time, the battery temperature, and the SOC value at the predetermined different battery temperatures, the SOC value corresponding to the current initial power-on time can be determined, so that the SOC value corresponding to the current initial power-on time can be estimated, and the battery pack can thereby be characterized according to the obtained SOC value.

Moreover, in the SOH estimation method of the battery pack provided in the embodiment of the disclosure, first, the SOC value corresponding to the current initial power-on time is calculated, then the battery pack is controlled to charge starting from the current initial power-on time, and the corresponding actual charge capacity of the battery pack from the current initial power-on time to completion of the current charge, and the corresponding current battery temperature of the battery pack upon completion of the current charge are determined. Therefore, the actual charge capacity and the current battery temperature that are obtained can be accurate. In addition, according to the current battery temperature and the pre-stored correspondence between the battery temperature and the maximum charge capacity of the battery pack upon completion of the current charge, the maximum charge capacity corresponding to the current battery temperature is determined. Afterwards, the target SOH value of the SOH of the battery pack can be determined according to the actual charge capacity, the maximum charge capacity corresponding to the current battery temperature, and the determined SOC value corresponding to the current initial power-on time. Accordingly, the obtained target SOH value can be accurate, so that the attenuation of the battery pack can be characterized accurately.

In the SOH estimation method of the battery pack provided in the embodiment of the disclosure, the corresponding total charge capacity of the battery pack from completion of the first charge to completion of the current charge may be determined by accumulating the charge capacity of each charge. Afterwards, the target SOH value may be determined according to the total charge capacity and the predetermined capacity change threshold to characterize the influence of the cyclic charge of the battery pack on its attenuation.

In the SOH estimation method of the battery pack provided in the embodiment of the disclosure, the corresponding first SOH value of the battery pack from the current initial power-on time to completion of the current charge is determined, the corresponding second SOH value of the battery pack from completion of the first charge to completion of the current charge is determined, and then according to the first SOH value and the second SOH value, the corresponding target SOH value of the battery pack can be determined, so that the attenuation of the battery pack can be characterized by the target SOH value.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances, proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

Figure 1:
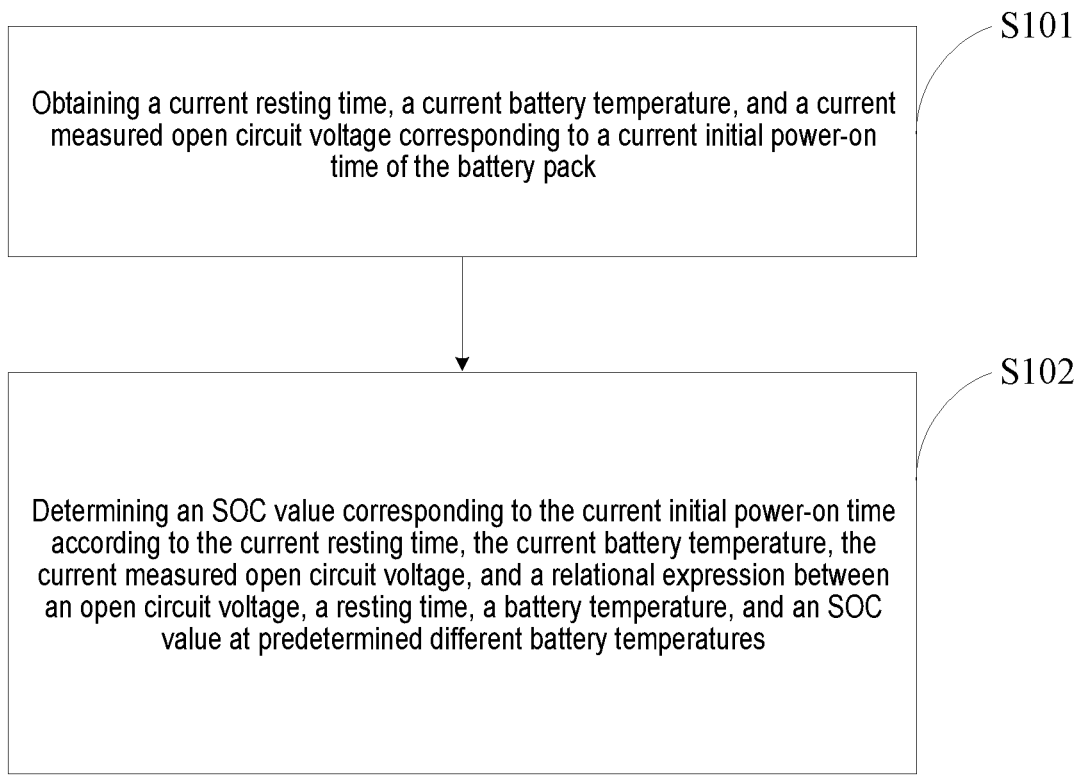
FIG. 1 is a flowchart showing an SOC estimation method of a battery pack provided in an embodiment of the disclosure.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

It is noted that the size and shape of each figure in the accompanying drawings do not reflect the actual scale, but are only meant to illustrate the content of the disclosure. Moreover, the same or similar reference numerals throughout the text indicate the same or similar elements or elements having the same or similar functions.

An electric vehicle refers to a vehicle which is powered by a vehicle-mounted power source (e.g., a lithium battery pack), drive the wheels by a motor, and comply with road traffic and safety regulations. The electric vehicle is provided with a battery management system for managing the use of batteries. The state of charge (SOC) of the battery reflects the remaining capacity of the battery. However, it is generally difficult to directly measure and obtain the SOC value. As a result, the estimation of the SOC value becomes important for ensuring the safe use of the battery and extending the cycle life of the battery.

An embodiment of the disclosure provides an SOC estimation method of a battery pack, which, as shown in FIG. 1, may include the following steps.

S101: A current resting time, a current battery temperature, and a current measured open circuit voltage corresponding to a current initial power-on time of a battery pack are obtained.

S102: According to the current resting time, the current battery temperature, the current measured open circuit voltage, and a relational expression between an open circuit voltage, a resting time, a battery temperature, and an SOC value at predetermined different battery temperatures, an SOC value corresponding to the current initial power-on time is determined.

In the SOC estimation method of the battery pack provided in the embodiment of the disclosure, the current resting time, the current battery temperature, and the current measured open circuit voltage corresponding to the current initial power-on time of the battery pack are first obtained, and then according to the obtained current resting time, current battery temperature, and current measured open circuit voltage, and the relational expression between the open circuit voltage, the resting time, the battery temperature, and the SOC value at the predetermined different battery temperatures, the SOC value corresponding to the current initial power-on time can be determined, so that the SOC value corresponding to the current initial power-on time can be estimated, and the battery pack can thereby be characterized according to the obtained SOC value.

As an example, the battery pack in the disclosure may be a lithium-ion power battery or may be another rechargeable battery, which is not limited thereto.

As an example, the battery pack in the disclosure may include multiple battery cells. The above battery temperature may be set as the minimum value among the battery temperatures corresponding to the battery cells in the battery pack. In actual implementation, the battery temperature of battery each battery cell may be detected to obtain the battery temperatures of the battery cells, so that the minimum value among the battery temperatures of the battery cells can be taken as the above battery temperature. In an example, the current battery temperature may be set as the minimum value among the current battery temperatures corresponding to the battery cells in the battery pack. In actual implementation, the battery temperature of each battery cell may be detected to obtain the battery temperatures of the battery cells, so that the minimum value among the battery temperatures of the battery cells can be taken as the current battery temperature of the battery pack. Moreover, the multiple battery cells may be at least two battery cells. Of course, in actual implementation, the above may be designed and determined according to the actual implementation environment and is not limited herein.

In step S101 above, the current resting time may refer to a time period in which the battery pack is in a non-operating state. For example, when the battery pack is applied to an electric vehicle, the electric vehicle starts to drive, and after the vehicle stops and is powered off or uses a current of the battery pack that remains less than a certain small current value, the time period starting from this moment until the time when the power of the electric vehicle is turned on again may be the current resting time.

In step S101 above, the current resting time, the current battery temperature, and the current measured open circuit voltage may be obtained through measurement. The terminal voltage of the battery pack in an open circuit state is referred to as an open circuit voltage (OCV).

Optionally, in actual implementation, the step of determining the SOC value corresponding to the current initial power-on time may include the following steps. An open circuit voltage closest to the current measured open circuit voltage is determined according to the current resting time, the current battery temperature, and a relational expression of open circuit voltages corresponding to multiple different SOC values at the predetermined different battery temperatures, where the multiple different SOC values may be at least two different SOC values. According to the determined open circuit voltage closest to the current measured open circuit voltage and its corresponding SOC value, the SOC value corresponding to the current initial power-on time is determined.

As an example, when the interval between the multiple different SOC values is selected to be small (e.g., the SOC value is selected by adopting an interval of 1%), the selected SOC values are dense, so that the open circuit voltages corresponding to the selected SOC values are also dense. Therefore, it is possible that the current measured open circuit voltage may be the same as the open circuit voltage corresponding to the SOC value, so that among the open circuit voltages corresponding to the SOC values, the open circuit voltage that is the same as the current measured open circuit voltage may be taken as the open circuit voltage closest to the current measured open circuit voltage. Furthermore, the SOC value corresponding to the open circuit voltage closest to the current measured open circuit voltage may be directly determined as the SOC value corresponding to the current initial power-on time.

It is noted that the specific number of the above relational expression of the open circuit voltages corresponding to the multiple different SOC values at the predetermined different battery temperatures may be designed and determined according to the actual implementation environment and is not limited herein.

As an example, when the interval between the multiple different SOC values is selected to be large (e.g., the SOC value is selected by adopting an interval of 4%), it is possible that the current measured open circuit voltage may not be the same as the open circuit voltage corresponding to the SOC value. For this situation, optionally, in actual implementation, the step of determining the open circuit voltage closest to the current measured open circuit voltage may include the following steps. The open circuit voltages corresponding to the multiple different SOC values at the current battery temperature are determined according to the current resting time, the current battery temperature, and the relational expression of the open circuit voltages corresponding to the multiple different SOC values at the predetermined different battery temperatures. A current maximum value and a current minimum value are determined from among the determined open circuit voltages corresponding to the multiple different SOC values at the current battery temperature, where the current maximum value is the maximum value among the open circuit voltages corresponding to the multiple different SOC values that are less than the current measured open circuit voltage, and the current minimum value is the minimum value among the open circuit voltages corresponding to the multiple different SOC values that are greater than the current measured open circuit voltage. The current maximum value and the current minimum value are determined as the open circuit voltage closest to the current measured open circuit voltage. Accordingly, the interval in which the current measured open circuit voltage falls can be obtained.

In addition, after obtaining the interval in which the current measured open circuit voltage falls, in actual implementation, the step of determining the SOC value corresponding to the current initial power-on time may include the following steps. A linear relational expression is determined according to the current maximum value and its corresponding SOC value, and the current minimum value and its corresponding SOC value. The SOC value corresponding to the current initial power-on time is determined according to the linear relational expression and the current measured open circuit voltage.

For example, the current maximum value OCVmax and its corresponding SOC value SOCmax, and the current minimum value OCVmin and its corresponding SOC value SOCmin are used to establish a linear relational expression in the form of $y_{SOC}=a_0 x_{OCV}+b_0$, where x represents the OCV value and y represents the SOC value. Accordingly, the above linear relational expression can be determined, where $a_0$ represents the slope and $b_0$ represents the constant. For example, if OCVmin=3.65V, SOCmin=50%, OCVmax=3.75V, and SOCmax=55%, then the coordinates of (x, y) may be, for example, (3.65, 0.5) and (3.75, 0.55), and a linear relational expression y=0.5x−1.325 can be determined. Afterwards, the obtained specific value $OCV_{cs}$ of the current measured open circuit voltage is substituted into $y_{SOC}=0.5x_{OCV}-1.325$, and the SOC value corresponding to the current initial power-on time can be obtained as $0.5*OCV_{cs}-1.325$. Of course, the above specific numerical values are only used for illustration and do not limit the specific parameters required by the battery pack in actual implementation.

Optionally, in actual implementation, a relational expression of an open circuit voltage corresponding to an $m^{th}$ SOC value in the relational expression of the open circuit voltages corresponding to the multiple different SOC values may be as follows:

$$OCV(t)-m = a_{-m}\log(t) + b_{-m}t + c_{-m}$$

where $a_{-m}$, $b_{-m}$, and $c_{-m}$ represent constant coefficients, t represents the resting time, and $OCV(t)_{-m}$ represents the open circuit voltage corresponding to the $m^{th}$ SOC value at the resting time t. The value range of m is 1 to M.

Optionally, $a_{-m}$, $b_{-m}$, and $c_{-m}$ may be real numbers, which are constants. Of course, in actual implementation, the above may be designed and determined according to the actual implementation environment and is not limited herein.

The relational expression of the open circuit voltages corresponding to the multiple different SOC values at the predetermined different battery temperatures may be as follows, for example: a relational expression of open circuit voltages corresponding to M SOC values at a battery temperature Tmin1 (e.g., 25° C.), a relational expression of open circuit voltages corresponding to M SOC values at a battery temperature Tmin2 (e.g., 20° C.), a relational expression of open circuit voltages corresponding to M SOC values at a battery temperature Tmin3 (e.g., 15° C.), a relational expression of open circuit voltages corresponding to M SOC values at a battery temperature Tmin4 (e.g., 10° C.), and a relational expression of open circuit voltages corresponding to M SOC values at a battery temperature Tmin5 (e.g., 5° C.). The above battery temperature may be the minimum battery temperature corresponding to the battery cells. Of course, the disclosure includes the above examples but is not limited thereto. In actual implementation, the above may be designed and determined according to the actual implementation environment and is not limited herein.

Taking the relational expression of the open circuit voltages corresponding to the M SOC values at the battery temperature Tmin1 as an example, M may be set as 21, and a value may be taken from 0% to 100% at an interval of 4%. In other words, the 21 SOC values may be 0, 5%, 10%, 15%, 20%, 25%, 30%, 35%, 40%, 45%, 50%, 55%, 60%, 65%, 70%, 75%, 80%, 85%, 90%, 95%, and 100%.

When the SOC value is 0, it corresponds to the relational expression of a $1^{st}$ open circuit voltage: $OCV(t)_{-1}=a_{-1}\log(t)+b_{-1}t+c_{-1}$.

When the SOC value is 5%, it corresponds to the relational expression of a $2^{nd}$ open circuit voltage: $OCV(t)_{-2}=a_{-2}\log(t)+b_{-2}t+c_{-2}$.

When the SOC value is 10%, it corresponds to the relational expression of a $3^{rd}$ open circuit voltage: $OCV(t)_{-3}=a_{-3}\log(t)+b_{-3}t+c_{-3}$.

When the SOC value is 15%, it corresponds to the relational expression of a $4^{th}$ open circuit voltage: $OCV(t)_{-4}=a_{-4}\log(t)+b_{-4}t+c_{-4}$.

When the SOC value is 20%, it corresponds to the relational expression of a $5^{th}$ open circuit voltage: $OCV(t)_{-5}=a_{-5}\log(t)+b_{-5}t+c_{-5}$.

When the SOC value is 25%, it corresponds to the relational expression of a $6^{th}$ open circuit voltage: $OCV(t)_{-6}=a_{-6}\log(t)+b_{-6}t+c_{-6}$.

When the SOC value is 30%, it corresponds to the relational expression of a $7^{th}$ open circuit voltage: $OCV(t)_{-7}=a_{-7}\log(t)+b_{-7}t+c_{-7}$.

When the SOC value is 35%, it corresponds to the relational expression of an $8^{th}$ open circuit voltage: $OCV(t)_{-8}=a_{-8}\log(t)+b_{-8}t+c_{-8}$.

When the SOC value is 40%, it corresponds to the relational expression of a $9^{th}$ open circuit voltage: $OCV(t)_{-9}=a_{-9}\log(t)+b_{-9}t+c_{-9}$.

When the SOC value is 45%, it corresponds to a relational expression of a $10^{th}$ open circuit voltage: $OCV(t)_{-10}=a_{-10}\log(t)+b_{-10}t+c_{-10}$.

When the SOC value is 50%, it corresponds to the relational expression of an $11^{th}$ open circuit voltage: $OCV(t)_{-11}=a_{-11}\log(t)+b_{-11}t+c_{-11}$.

When the SOC value is 55%, it corresponds to the relational expression a $12^{th}$ open circuit voltage: $OCV(t)_{-12}=a_{-12}\log(t)+b_{-12}t+c_{-12}$.

When the SOC value is 60%, it corresponds to the relational expression of a $13^{th}$ open circuit voltage: $OCV(t)_{-13}=a_{-13}\log(t)+b_{-13}t+c_{-13}$.

When the SOC value is 65%, it corresponds to the relational expression of a $14^{th}$ open circuit voltage: $OCV(t)_{-14}=a_{-14}\log(t)+b_{-14}t+c_{-14}$.

When the SOC value is 70%, it corresponds to the relational expression of a $15^{th}$ open circuit voltage: $OCV(t)_{-15}=a_{-15}\log(t)+b_{-15}t+c_{-15}$.

When the SOC value is 75%, it corresponds to the relational expression of a $16^{th}$ open circuit voltage: $OCV(t)_{-16}=a_{-16}\log(t)+b_{-16}t+c_{-16}$.

When the SOC value is 80%, it corresponds to the relational expression of a $17^{th}$ open circuit voltage: $OCV(t)_{-17}=a_{-17}\log(t)+b_{-17}t+c_{-17}$.

When the SOC value is 85%, it corresponds to the relational expression of an $18^{th}$ open circuit voltage: $OCV(t)_{-18}=a_{-18}\log(t)+b_{-18}t+c_{-18}$.

When the SOC value is 90%, it corresponds to the relational expression of a $19^{th}$ open circuit voltage: $OCV(t)_{-19}=a_{-19}\log(t)+b_{-19}t+c_{-19}$.

When the SOC value is 95%, it corresponds to the relational expression of a $20^{th}$ open circuit voltage: $OCV(t)_{-20}=a_{-20}\log(t)+b_{-20}t+c_{-20}$.

When the SOC value is 100%, it corresponds to the relational expression of a $21^{st}$ open circuit voltage: $OCV(t)_{-21}=a_{-21}\log(t)+b_{-21}t+c_{-21}$.

Of course, the value of M required by the battery pack in different implementation environments may be different, so the values taken from 0 to 100% at an interval of the same value are also different. Accordingly, the number of the SOC values may be designed according to the actual implementation environment and is not limited herein.

The relational expression of the open circuit voltage corresponding to the $m^{th}$ SOC value may be predetermined and stored. Optionally, in actual implementation, the method of determining the relational expression of the open circuit voltage corresponding to the $m^{th}$ SOC value may include the following steps. A battery cell sample is selected. Open circuit voltages and SOC values of the battery cell sample are obtained at different battery temperatures within different resting times of the battery cell sample. The open circuit voltages and the SOC values of the battery cell sample obtained within the different resting times are fitted by using a least square method to determine the relational expression of the open circuit voltage corresponding to the $m^{th}$ SOC value.

For example, any one battery cell may be selected from the multiple battery cells as the battery cell sample. At the battery temperature Tmin1, an open circuit voltage and an SOC value of the battery cell sample at a resting time t01, an open circuit voltage and an SOC value at a resting time t02, an open circuit voltage and an SOC value at a resting time t03, an open circuit voltage and an SOC value at a resting time t04, and an open circuit voltage and an SOC value at a resting time t05 are obtained. Similarly, the above operations are performed on the battery cell sample respectively at the battery temperatures Tmin2, Tmin3, Tmin4, and Tmin5. Afterwards, the open circuit voltages and the SOC values at the battery temperature Tmin1 and the resting times t01 to t05 are fitted by using the least square method to determine the relational expression of the above open circuit voltage. Of course, in actual implementation, the above may be designed and determined according to the actual implementation environment and is not limited herein.

Generally, if the current resting time is short, the estimation error may be large. In order to reduce the estimation error, in actual implementation, after obtaining the current resting time, the current battery temperature, and the current measured open circuit voltage of the battery pack corresponding to the current initial power-on time, and before determining the open circuit voltages corresponding to the multiple different SOC values at the current battery temperature, it may be further determined whether the current resting time corresponding to the current initial power-on time is greater than a resting time feature value. In addition, the step of determining the open circuit voltages corresponding to the multiple different SOC values at the current battery temperature may include the following step. When it is determined that the current resting time corresponding to the current initial power-on time is greater than the resting time feature value, the open circuit voltages corresponding to the multiple different SOC values at the current battery temperature are determined. Accordingly, when the current resting time corresponding to the current initial power-on time is greater than the resting time feature value, it means that the error is small in the open circuit voltages corresponding to the multiple different SOC values at the current battery temperature which are determined according to the relational expression of the open circuit voltages corresponding to the multiple different SOC values at the predetermined different minimum battery temperatures.

When it is determined that the current resting time corresponding to the current initial power-on time is not greater than the resting time feature value, it means that the error is large, and the process of the SOC estimation method may be stopped.

The resting time feature value corresponds to different battery temperatures in a one-to-one manner. For example, the battery temperature Tmin1 corresponds to a resting time feature value $\Delta t1$, the battery temperature Tmin2 corresponds to a resting time feature value $\Delta t2$, the battery temperature Tmin3 corresponds to a resting time feature value $\Delta t3$, the battery temperature Tmin4 corresponds to a resting time feature value $\Delta t4$, and the battery temperature Tmin5 corresponds to a resting time feature value $\Delta t5$. Moreover, the resting time feature value may be a value determined according to actual experience. In actual implementation, the resting time feature value may be designed and determined according to the actual application environment and is not limited herein.

Next, the SOC estimation method of the battery pack provided in the embodiment of the disclosure will be described based on the example of a battery pack in which the rated capacity is 100 Ah, the current resting time at a normal temperature (e.g., 25° C.) is 1 h, and the current measured open circuit voltage $OCV_0$ corresponding to the current initial power-on time is 3563 mV, and M=21.

The SOC estimation method of the battery pack provided in the embodiment of the disclosure may include the following steps.

(1) The current resting time t=1 h, the current battery temperature Tmin0=25° C., and the current measured open circuit voltage $OCV_0$=3563 mV corresponding to the current initial power-on time of the battery pack are measured and obtained.

(2) It is determined whether the current resting time t=1 h corresponding to the current initial power-on time is greater than the resting time feature value $\Delta t1$=30 min.

(3) Since $t>\Delta t1$, then according to the current resting time t=1 h, the current battery temperature Tmin0=25° C., and the relational expressions $OCV(t)_{-1}=a_{-1} \log (t)+b_{-1}t+c_{-1}, \ldots, OCV(t)_{-21}=a_{-21} \log (t)+b_{-21}t+c_{-21}$ of the open circuit voltages corresponding to the $1^{st}$ to $21^{st}$ SOC values at the predetermined battery temperature Tmin1 (e.g., 25° C.), the corresponding open circuit voltage $OCV(t)_{-1}$ when the SOC value is 0, the corresponding open circuit voltage $OCV(t)_{-2}$ when the SOC value is 5%, the corresponding open circuit voltage $OCV(t)_{-3}$ when the SOC value is 10%, the corresponding open circuit voltage $OCV(t)_{-4}$ when the SOC value is 15%, and the corresponding open circuit voltage $OCV(t)_{-5}$ when the SOC value is 20% at the current battery temperature Tmin0=25° C. can be determined. The rest can be determined in the same manner and will not be repeatedly described herein.

(4) From among the determined open circuit voltages $OCV(t)_{-1}$ to $OCV(t)_{-21}$ corresponding to the 21 SOC values at the current battery temperature Tmin0=25° C., the current maximum value OCVmax and the current minimum value OCVmin are determined. The current maximum value OCVmax is the maximum value among the values of $OCV(t)_{-1}$ to $OCV(t)_{-21}$ that are less than $OCV_0$, and the current minimum value OCVmin is the minimum value among the values of $OCV(t)_{-1}$ to $OCV(t)_{-21}$ that are greater than $OCV_0$. For example, $OCV(t)_{-11}$ is the current maximum value OCVmax, and $OCV(t)_{-12}$ is the current minimum value OCVmin. Then, it can be determined that $OCV_0$ is in an interval formed by $[OCV(t)_{-11}, OCV(t)_{-12}]$.

For example, the open circuit voltages $OCV(t)_{-11}$ and $OCV(t)_{-12}$ which are closest to $OCV_0$ may be determined from among $OCV(t)_{-1}$ to $OCV(t)_{-21}$ through a bisection method.

(5) According to the open circuit voltage $OCV(t)_{-11}$ and its corresponding SOC value of 50%, and the open circuit voltage $OCV(t)_{-12}$ and its corresponding SOC value of 55%, the specific values of a0 and b0 in the linear relational expression $y_{SOC}=a_0x_{OCV}+b_0$ may be determined, and the linear relational expression $y_{SOC}=a_0x_{OCV}+b_0$ may be further obtained.

(6) The current measured open circuit voltage $OCV_0$ is substituted into the linear relational expression $y_{SOC}=a_0x_{OCV}+b_0$ to obtain the SOC value corresponding to the current initial power-on time corresponding to the current measured open circuit voltage $OCV_0$.

At present, one of the biggest factors restricting the popularization of electric vehicles is the service life of power batteries. The performances of battery cells formed in packs differ from each other, and their charge and discharge temperature, self-discharge rate, and environment of use are also different. As a result, the service life of the battery pack is significantly reduced, and namely, the state of health (SOH) of the battery is attenuated. The SOH of the battery characterizes that as the times of use of the battery increase, its actual capacity gradually declines.

Figure 2:
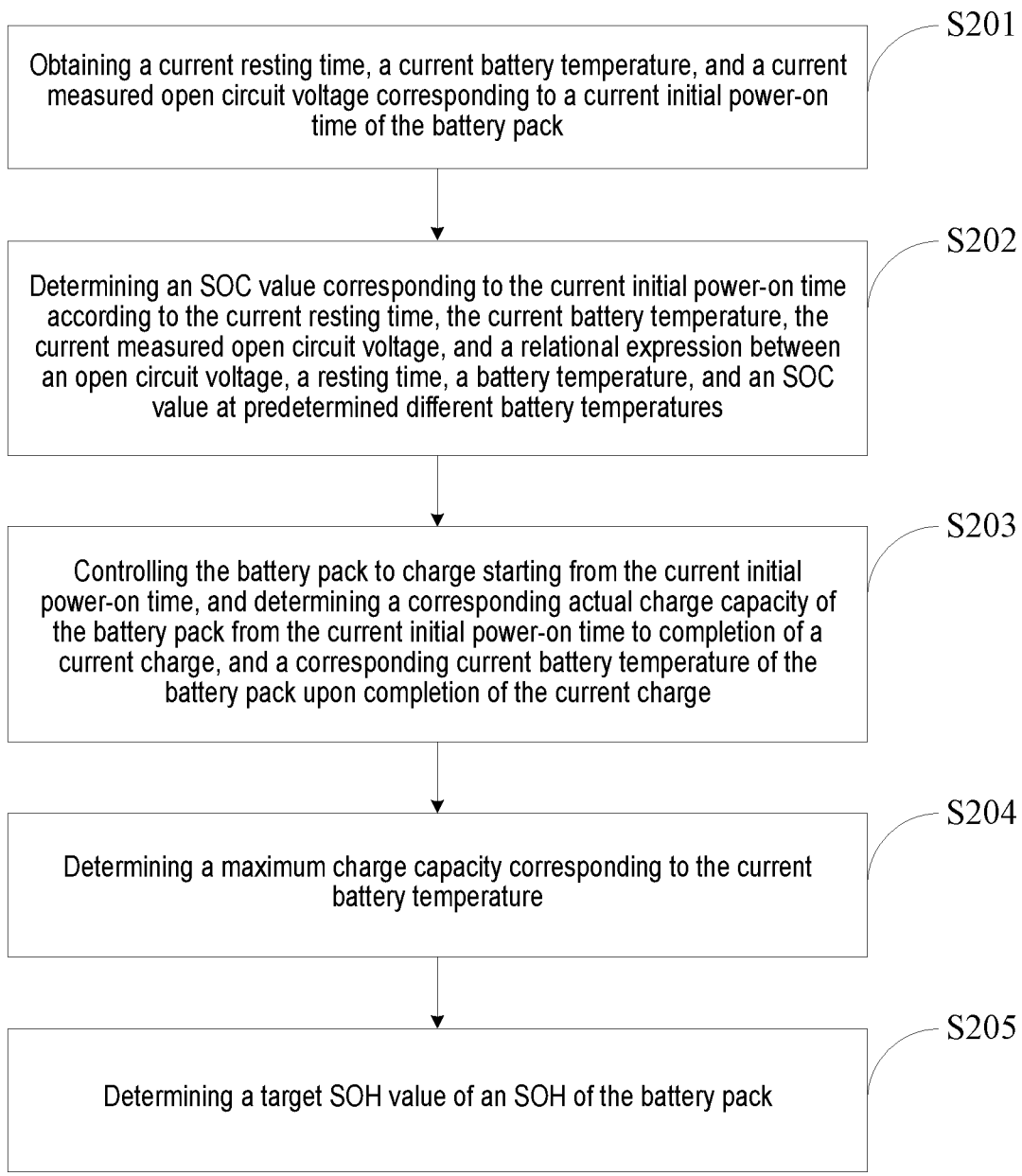
FIG. 2 is a flowchart showing an SOH estimation method of a battery pack provided in an embodiment of the disclosure.

Based on the above, an embodiment of the disclosure also provides an SOH estimation method of a battery pack, which, as shown in FIG. 2, may include the following steps.

S201: A current resting time, a current battery temperature, and a current measured open circuit voltage corresponding to a current initial power-on time of a battery pack are obtained.

S202: According to the current resting time, the current battery temperature, the current measured open circuit voltage, and a relational expression between an open circuit voltage, a resting time, a battery temperature, and an SOC value at predetermined different battery temperatures, an SOC value corresponding to the current initial power-on time is determined.

S203: The battery pack is controlled to charge starting from the current initial power-on time, and a corresponding actual charge capacity of the battery pack from the current initial power-on time to completion of a current charge, and a corresponding current battery temperature of the battery pack upon completion of the current charge are determined.

S204: A maximum charge capacity corresponding to the current battery temperature is determined according to the current battery temperature and a pre-stored correspondence between the battery temperature and the maximum charge capacity of the battery pack upon completion of the current charge.

S205: A target SOH value of the SOH of the battery pack is determined according to the actual charge capacity, the maximum charge capacity corresponding to the current battery temperature, and the determined SOC value corresponding to the current initial power-on time.

In actual implementation, for step S205 above, the following relational expression is adopted to determine the target SOH value of the SOH of the battery pack:

$$SOH_0 = \frac{Ccharge}{Ccor * (100\% - SOC_0)}$$

where $SOH_0$ represents the target SOH value of the SOH of the battery pack, Ccharge represents the actual charge capacity, Ccor represents the maximum charge capacity corresponding to the current battery temperature, and $SOC_0$ represents the determined SOC value corresponding to the current initial power-on time.

In the SOH estimation method of the battery pack provided in the embodiment of the disclosure, first, the SOC value corresponding to the current initial power-on time is calculated, then the battery pack is controlled to charge starting from the current initial power-on time, and the corresponding actual charge capacity of the battery pack from the current initial power-on time to completion of the current charge, and the corresponding current battery temperature of the battery pack upon completion of the current charge are determined. Therefore, the actual charge capacity and the current battery temperature that are obtained can be accurate. In addition, according to the current battery temperature and the pre-stored correspondence between the battery temperature and the maximum charge capacity of the battery pack upon completion of the current charge, the maximum charge capacity corresponding to the current battery temperature is determined. Afterwards, the target SOH value of the SOH of the battery pack can be determined according to the actual charge capacity, the maximum charge capacity corresponding to the current battery temperature, and the determined SOC value corresponding to the current initial power-on time. Accordingly, the obtained target SOH value can be accurate, so that the attenuation of the battery pack can be characterized accurately.

It is noted that the implementation process of steps S201 to S202 above may be substantially the same as steps S101 to S102 described above. Reference may be made to the foregoing embodiment for the details thereof, which shall not be repeatedly described herein.

In actual implementation, after determining the SOC value corresponding to the current initial power-on time, and before controlling the battery pack to charge starting from the current initial power-on time, it may be further determined whether the SOC value is less than an SOC feature value. Moreover, in the embodiment of the disclosure, the step of controlling the battery pack to charge starting from the current initial power-on time may specifically include the following step. When it is determined that the SOC value is less than the SOC feature value, the battery pack is controlled to charge starting from the current initial power-on time. When it is determined that the SOC value is less than the SOC feature value, it means that the error in the calculated SOC value corresponding to the current initial power-on time is small, and namely, the precision is high, so that the target SOH value obtained in the following process can be accurate.

When it is determined that the SOC value is not less than the SOC feature value, it means that the error in the calculated SOC value corresponding to the current initial power-on time is large, and the process of the SOH estimation method may be stopped.

The SOC feature value may be a value determined according to actual experience. For example, the SOC feature value may be 30%, so when the obtained SOC value is less than 30%, it means that the obtained SOC value is accurate. Of course, in actual implementation, the SOC feature value may be designed and determined according to the actual implementation environment and is not limited herein.

The actual charge capacity and the current battery temperature may be obtained through measurement. Of course, in actual implementation, the actual charge capacity and the current battery temperature may be designed and determined according to the actual implementation environment and are not limited herein.

The pre-stored correspondence between the battery temperature and the maximum charge capacity of the battery pack upon completion of the current charge may be a battery temperature-maximum charge capacity matrix table. For example, it may include multiple battery temperatures upon completion of the current charge, and a maximum charge capacity corresponding in a one-to-one manner to each battery temperature upon completion of the current charge. For example, a battery temperature $Tcd_{-1}$ upon completion of the current charge corresponds to a maximum charge capacity $Ccor_{-1}$, a battery temperature $Tcd_{-2}$ upon completion of the current charge corresponds to a maximum charge capacity $Ccor_{-2}$, a battery temperature $Tcd_{-3}$ upon completion of the current charge corresponds to a maximum charge capacity $Ccor_{-3}$, a battery temperature $Tcd_{-4}$ upon completion of the current charge corresponds to a maximum charge capacity $Ccor_{-4}$, and so on. In addition, the pre-stored correspondence between the battery temperature and the maximum charge capacity of the battery pack upon completion of the current charge is obtained according to multiple actual measurements and calculations.

The pre-stored correspondence between the battery temperature and the maximum charge capacity of the battery pack upon completion of the current charge may also be obtained based on experience and is not limited herein.

Next, the SOH estimation method of the battery pack provided in the embodiment of the disclosure will be described based on the example of a battery pack in which the rated capacity is 100 Ah, the current resting time at a normal temperature (e.g., 25° C.) is 1 h, and the current measured open circuit voltage $OCV_0$ corresponding to the current initial power-on time is 3563 mV, the battery pack is charged until the cell voltage reaches a full charge state of 4250 mV, and M=21.

The SOH estimation method of the battery pack provided in the embodiment of the disclosure may include the following steps.

(1) The current resting time t=1 h, the current battery temperature Tmin0=25° C., and the current measured open circuit voltage $OCV_0$=3563 mV corresponding to the current initial power-on time of the battery pack are measured and obtained.

(2) It is determined whether the current resting time t=1 h corresponding to the current initial power-on time is greater than the resting time feature value Δt1=30 min.

(3) Since t>Δt1, then according to the current resting time t=1 h, the current battery temperature Tmin0=25° C., and the relational expressions $OCV(t)_{-1}=a_{-1} \log (t)+b_{-1}t+c_{-1}, \ldots,$ $OCV(t)_{-21}=a_{-21} \log (t)+b_{-21}t+c_{-21}$ of the open circuit voltages corresponding to the 1$^{st}$ to 21$^{st}$ SOC values at the predetermined battery temperature Tmin1 (e.g., 25° C.), the corresponding open circuit voltage $OCV(t)_{-1}$ when the SOC value is 0, the corresponding open circuit voltage $OCV(t)_{-2}$ when the SOC value is 5%, the corresponding open circuit voltage $OCV(t)_{-3}$ when the SOC value is 10%, the corresponding open circuit voltage $OCV(t)_{-4}$ when the SOC value is 15%, and the corresponding open circuit voltage $OCV(t)_{-5}$ when the SOC value is 20% at the current battery temperature Tmin0=25° C. can be determined. The rest can be determined in the same manner and will not be repeatedly described herein.

(4) From among the determined open circuit voltages $OCV(t)_{-1}$ to $OCV(t)_{-21}$ corresponding to the 21 SOC values at the current battery temperature Tmin0=25° C., the current maximum value OCVmax and the current minimum value OCVmin are determined. The current maximum value OCVmax is the maximum value among the values of $OCV(t)_{-1}$ to $OCV(t)_{-21}$ that are less than $OCV_0$, and the current minimum value OCVmin is the minimum value among the values of $OCV(t)_{-1}$ to $OCV(t)_{-21}$ that are greater than $OCV_0$. For example, $OCV(t)_{-4}$ is the current maximum value OCVmax, and $OCV(t)_{-5}$ is the current minimum value OCVmin. Then, it can be determined that $OCV_0$ is in an interval formed by $[OCV(t)_{-4}, OCV(t)_{-5}]$.

For example, the open circuit voltages $OCV(t)_{-4}$ and $OCV(t)_{-5}$ which are closest to $OCV_0$ may be determined from among $OCV(t)_{-1}$ to $OCV(t)_{-21}$ through a bisection method.

(5) According to the open circuit voltage $OCV(t)_{-4}$ and its corresponding SOC value of 15%, and the open circuit voltage $OCV(t)_{-5}$ and its corresponding SOC value of 20%, the specific values of a0 and b0 in the linear relational expression $y_{SOC}=a_0 x_{OCV}+b_0$ may be determined, and the linear relational expression $y_{SOC}=a_0 x_{OCV}+b_0$ may be further obtained.

(6) The current measured open circuit voltage $OCV_0$ is substituted into the linear relational expression $y_{SOC}=a_0 x_{OCV}+b_0$ to obtain the SOC value, i.e., $SOC_0$, corresponding to the current initial power-on time corresponding to the current measured open circuit voltage $OCV_0$. For example, $SOC_0$=20%.

(7) Since the obtained SOC value of 20% is less than the SOC feature value of 30%, the battery pack may be controlled to charge starting from the current initial power-on time, and the corresponding actual charge capacity Ccharge of 75 Ah of the battery pack from the current initial power-on time to completion of the current charge, and the corresponding current battery temperature $Tcd_{-2}$ of the battery pack upon completion of the current charge are measured and obtained.

(8) According to the obtained current battery temperature $Tcd_{-2}$, the battery temperature-maximum charge capacity matrix table is looked up to obtain the maximum charge capacity $Ccor_{-2}$ corresponding to the current battery temperature $Tcd_{-2}$. For example, $Ccor_{-2}$=98 Ah.

(9) Ccharge=75 Ah, Cor=$Ccor_{-2}$=98 Ah, and $SOC_0$=20% are substituted into the relational expression $$SOH_0 = \frac{Ccharge}{Ccor*(100\% - SOC_0)}$$

to obtain the target SOH value of 95.67%, i.e., $SOH_0$=95.67%.

Figure 3:
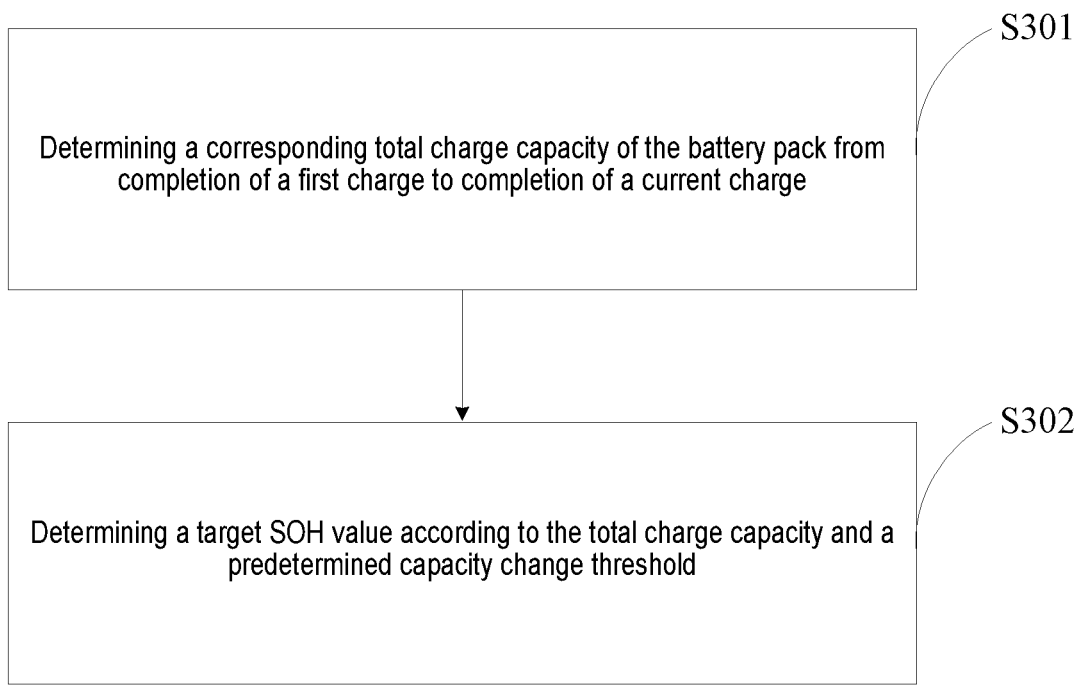
FIG. 3 is a flowchart showing first another SOH estimation method of a battery pack provided in an embodiment of the disclosure.

An embodiment of the disclosure further provides another SOH estimation method of a battery pack, which, as shown in FIG. 3, may include the following steps.

S301: A corresponding total charge capacity of a battery pack from completion of a first charge to completion of a current charge is determined, where the total charge capacity is a sum of charge capacities of the battery pack from completion of the first charge to completion of the current charge.

S302: A target SOH value is determined according to the total charge capacity and a predetermined capacity change threshold.

In the SOH estimation method of the battery pack provided in the embodiment of the disclosure, the corresponding total charge capacity of the battery pack from completion of the first charge to completion of the current charge may be determined by accumulating the charge capacity of each charge. Afterwards, the target SOH value may be determined according to the total charge capacity and the predetermined capacity change threshold to characterize the influence of the cyclic charge of the battery pack on its attenuation.

For example, completion of the first charge may refer to the following case. The battery pack is applied to an electric vehicle, and after the electric vehicle is assembled with the battery pack, the assembled battery pack is charged for the first time and is fully charged, which means that the first charge of the battery pack is completed. Moreover, the charge capacity upon completion of the first charge is the charge capacity upon full charge of the battery pack. Of course, in actual implementation, the charge capacity upon completion of the first charge may be designed and determined according to the actual implementation environment and is not limited herein.

In actual implementation, in the embodiment of the disclosure, for step S203 above, the step of determining the target SOH value may include the following steps. According to the relational expression $$SOH_{00} = \left(100 - \frac{Ctotal}{\Delta C}\right)\%,$$

the corresponding current SOH value of the battery pack is determined, where $SOH_{00}$ represents the current SOH value, Ctotal represents the total charge capacity, and $\Delta C$ represents the capacity change threshold. According to the determined current SOH value, the target SOH value of the battery pack is determined.

In actual implementation, the determined current SOH value may be directly taken as the target SOH value to characterize the influence of the cyclic charge of the battery pack on its attenuation.

In actual implementation, the step of determining the target SOH value of the battery pack according to the determined current SOH value may also include the following step. By using a moving average filtering method, according to the current SOH value, the corresponding target SOH value of the battery pack upon completion of the current charge after filtering is determined. Accordingly, the target SOH value can be updated and calculated through the moving average filtering method, so that the obtained target SOH value can be more accurate to further improve the accuracy of characterization of the influence of the cyclic charge of the battery pack on its attenuation.

It is noted that the total charge capacity may be the accumulated charge capacity of the electric vehicle during actual operation. For example, assuming that an electric vehicle has been used for three years, and during these three years, each completed charge corresponds to a charge capacity, and the sum of these charge capacities is the total charge capacity.

The capacity change threshold $\Delta C$ may be a value determined according to actual experience, for example, $\Delta C=1000$. Of course, in actual implementation, the capacity change threshold may be designed and determined according to the actual implementation environment and is not limited herein.

Next, the SOH estimation method of the battery pack provided in the embodiment of the disclosure will be described based on an example in which the rated capacity is 100 Ah, the corresponding total charge capacity from completion of the first charge to completion of the current charge is Ctotal=5000 Ah, and $\Delta C=1000$.

The SOH estimation method of the battery pack provided in the embodiment of the disclosure may include the following steps.

(1) The corresponding total charge capacity Ctotal=5000 Ah of the battery pack from completion of the first charge to completion of the current charge is determined.

(2) Ctotal=5000 Ah and $\Delta C=1000$ are substituted into the relational expression $$SOH_{00} = \left(100 - \frac{Ctotal}{\Delta C}\right)\%$$

to calculate and obtain $SOH_{00}=95\%$, namely, determining the corresponding current SOH value of the battery pack.

(3) By using the moving average filtering method, according to the current SOH value $SOH_{00}=95\%$, the corresponding target SOH value of the battery pack upon completion of the current charge after filtering is determined.

Specifically, the moving average filtering method may be operated as follows, for example. If the $SOH_{00}$ calculated and obtained based on the relational expression satisfied by the $SOH_{00}$ after the previous charging process is 96%, and if the difference between the calculation result $SOH_{00}$ this time and the previous calculation result $SOH_{00}$ is less than a determined threshold of 3%, then the calculation result $SOH_{00}$ this time is valid. It is assumed that a data queue A retains the calculation results $SOH_{00}$ of 10 valid charging processes. For example, the corresponding data queue upon completion of the previous charge is A={100%; 100%; 99%; 99%; 98%; 97%; 97%; 97%; 96%; 96%}. By using the moving average filtering algorithm, the result $SOH_{00}=95\%$ this time is stored in the data queue to obtain a new data queue A'={100%; 99%; 99%; 98%; 97%; 97%; 97%; 96%; 96%; 95%}. Afterwards, the data queue A' is averaged to obtain the target SOH value of 97.4%, and 97.4% is used to replace the original target SOH value of 97.9% for display.

Figure 4:
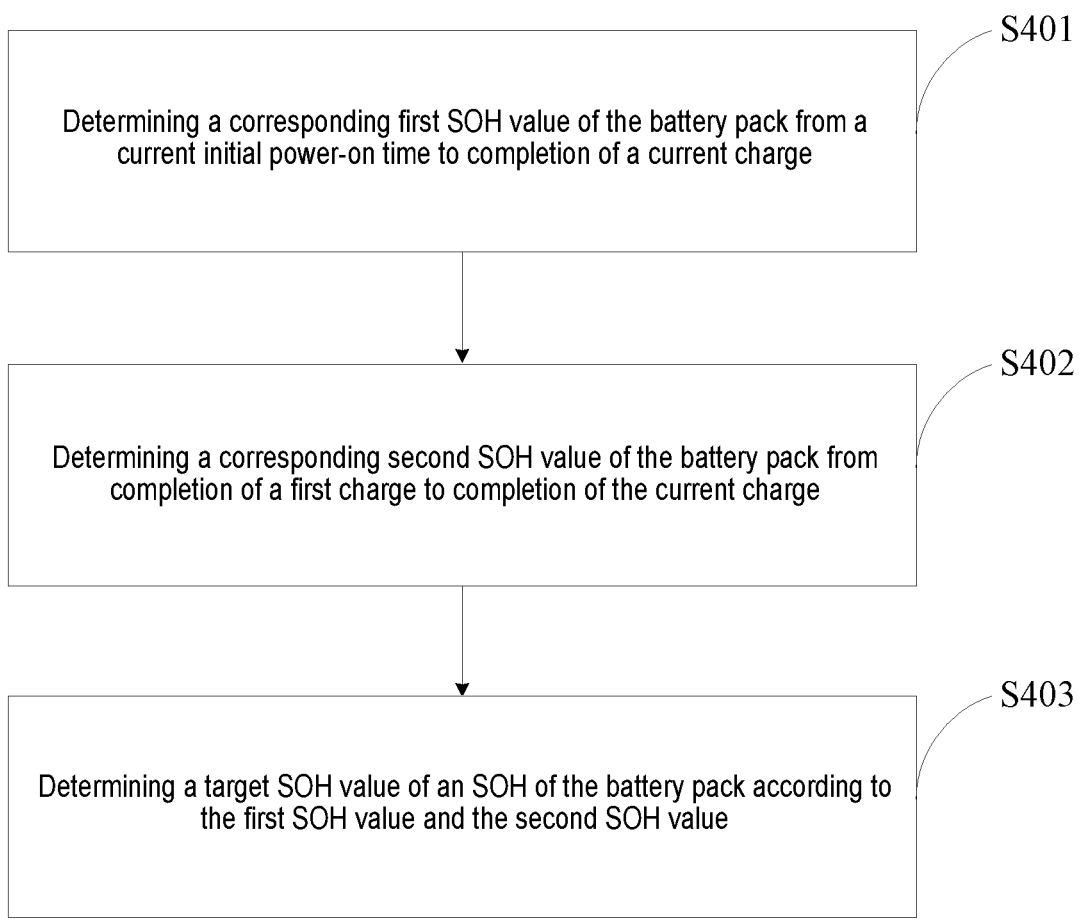
FIG. 4 is a flowchart showing second another SOH estimation method of a battery pack provided in an embodiment of the disclosure.

An embodiment of the disclosure provides still another SOH estimation method of a battery pack, which, as shown in FIG. 4, may include the following steps.

S401: A corresponding first SOH value of a battery pack from a current initial power-on time to completion of a current charge is determined.

S402: A corresponding second SOH value of the battery pack from completion of a first charge to completion of the current charge is determined. Step S402 may include the following steps. A corresponding total charge capacity of the battery pack from completion of the first charge to completion of the current charge is determined, and according to the total charge capacity and a predetermined capacity change threshold, the second SOH value of the battery pack is determined, where the total charge capacity is a sum of charge capacities of the battery pack from completion of the first charge to completion of the current charge.

S403: A target SOH value of an SOH of the battery pack is determined according to the first SOH value and the second SOH value.

In the SOH estimation method of the battery pack provided in the embodiment of the disclosure, the corresponding first SOH value of the battery pack from the current initial power-on time to completion of the current charge is determined, the corresponding second SOH value of the battery pack from completion of the first charge to completion of the current charge is determined, and then according to the first SOH value and the second SOH value, the corresponding target SOH value of the battery pack can be determined, so that the attenuation of the battery pack can be characterized by the target SOH value.

In actual implementation, the step of determining the corresponding target SOH value of the battery pack according to the first SOH value and the second SOH value may include the following steps. According to a relational expression $SOH_{000}=m*SOH_1+n*SOH_2$, a first intermediate SOH value of the battery pack is determined, where m and n respectively represent weighting factors, m+n=1, $SOH_1$ represents the first SOH value, $SOH_2$ represents the second SOH value, and $SOH_{000}$ represents the first intermediate SOH value. By using the moving average filtering method, the target SOH value after filtering is determined according to the first intermediate SOH value.

Figure 5:
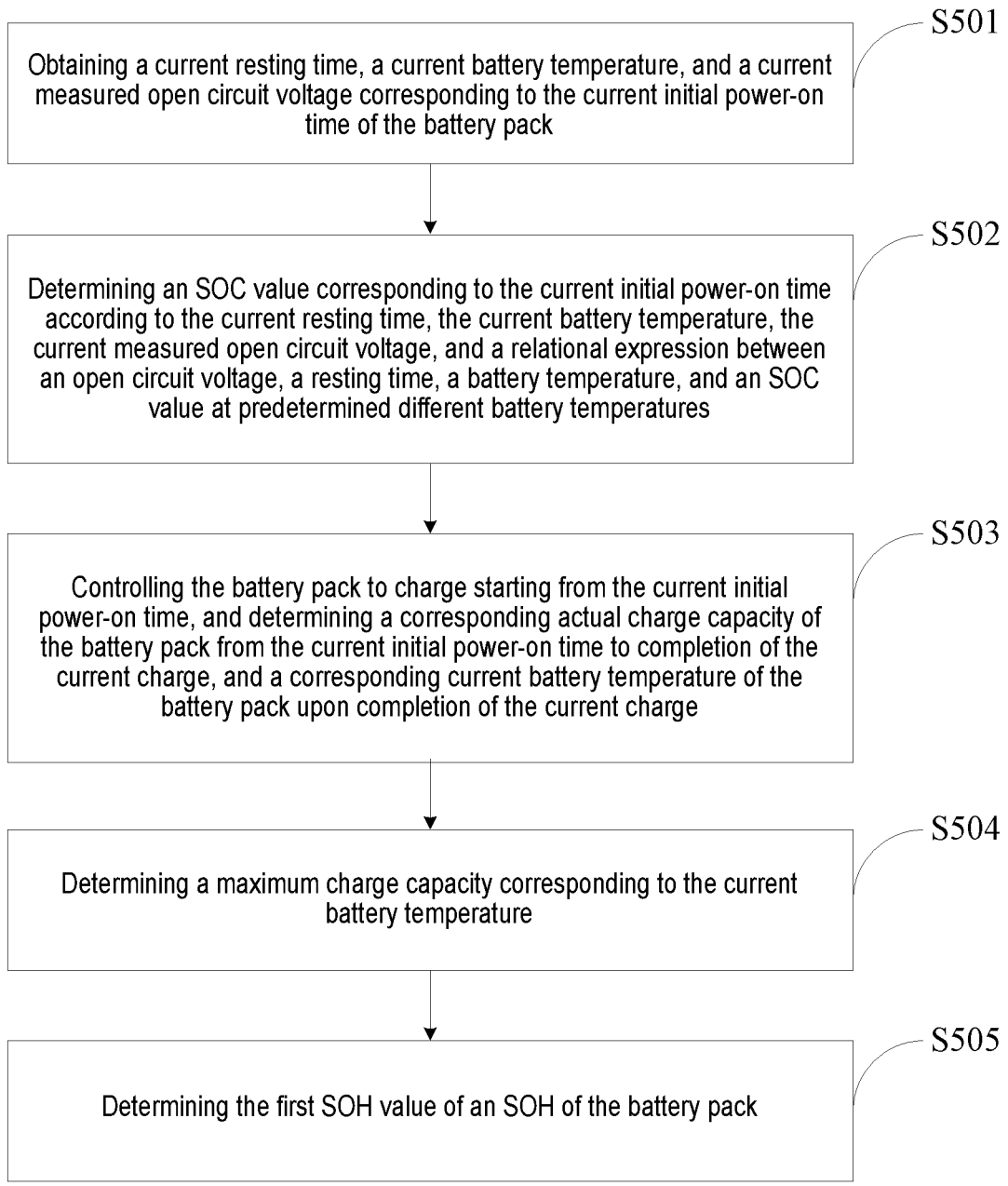
FIG. 5 is a flowchart showing determination on a first SOH value provided in an embodiment of the disclosure.

In actual implementation, the step of determining the corresponding first SOH value of the battery pack from the current initial power-on time to completion of the current charge may include the following steps as shown in FIG. 5.

S501: A current resting time, a current battery temperature, and a current measured open circuit voltage corresponding to a current initial power-on time of a battery pack are obtained.

S502: According to the current resting time, the current battery temperature, the current measured open circuit voltage, and a relational expression between an open circuit voltage, a resting time, a battery temperature, and an SOC value at predetermined different battery temperatures, an SOC value corresponding to the current initial power-on time is determined.

S503: The battery pack is controlled to charge starting from the current initial power-on time, and a corresponding actual charge capacity of the battery pack from the current initial power-on time to completion of a current charge, and a corresponding current battery temperature of the battery pack upon completion of the current charge are determined.

S504: A maximum charge capacity corresponding to the current battery temperature is determined according to the current battery temperature and a pre-stored correspondence between the battery temperature and the maximum charge capacity of the battery pack upon completion of the current charge.

S505: A first SOH value is determined according to the actual charge capacity, the maximum charge capacity corresponding to the current battery temperature, and the determined SOC value corresponding to the current initial power-on time.

In actual implementation, the following relational expression is adopted to determine the first SOH value:

$$SOH_1 = \frac{Ccharge}{Ccor*(100\% - SOC_0)}$$

where $SOH_1$ represents the first SOH value, Ccharge represents the actual charge capacity, Ccor represents the maximum charge capacity corresponding to the current battery temperature, and $SOC_0$ represents the SOC value corresponding to the current initial power-on time.

In actual implementation, after determining the SOC value corresponding to the current initial power-on time, and before controlling the battery pack to charge starting from the current initial power-on time, it may be further determined whether the SOC value is less than an SOC feature value. Moreover, in the embodiment of the disclosure, the step of controlling the battery pack to charge starting from the current initial power-on time may specifically include the following step. When it is determined that the SOC value is less than the SOC feature value, the battery pack is controlled to charge starting from the current initial power-on time. When it is determined that the SOC value is less than the SOC feature value, it means that the error in the calculated SOC value corresponding to the current initial power-on time is small, and namely, the precision is high, so that the target SOH value obtained in the following process can be accurate.

When it is determined that the SOC value is not less than the SOC feature value, it means that the error in the calculated SOC value corresponding to the current initial power-on time is large, and the process of the SOH estimation method may be stopped.

The process of determining the first SOH value in steps S501 to S505 may be substantially the same as the process of determining the target SOH value in steps S201 to S205. Therefore, reference may be made to the process of determining the target SOH value in steps S201 to S205 for the specific implementation process of determining the first SOH value in steps S501 to S505, which shall not be repeatedly described herein.

Figure 6:
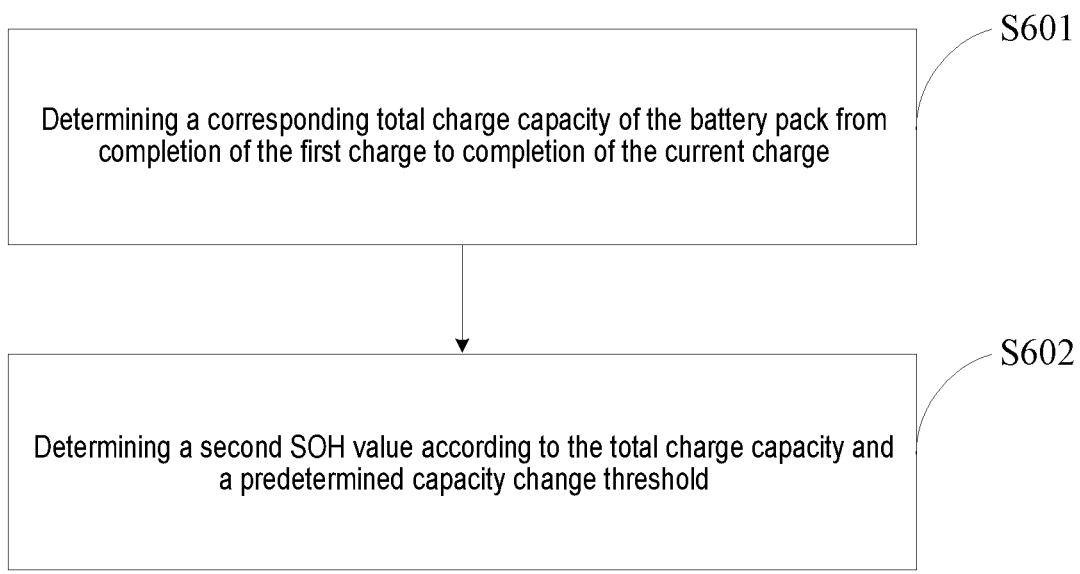
FIG. 6 is a flowchart showing determination on a second SOH value provided in an embodiment of the disclosure.

In actual implementation, in the embodiment of the disclosure, the step of determining the corresponding second SOH value of the battery pack from completion of the first charge to completion of the current charge may include the following steps as shown in FIG. 6.

S601: A corresponding total charge capacity of a battery pack from completion of a first charge to completion of a current charge is determined, where the total charge capacity is a sum of charge capacities of the battery pack from completion of the first charge to completion of the current charge.

S602: A second SOH value is determined according to the total charge capacity and a predetermined capacity change threshold.

In actual implementation, in the embodiment of the disclosure, the step of determining the second SOH value may include the following step. According to a relational expression $$SOH_2 = \left(100 - \frac{Ctotal}{\Delta C}\right)\%,$$

the corresponding second intermediate SOH value of the battery pack is determined, where $SOH_2$ represents the second intermediate $SOH_2$ value, Ctotal represents the total charge capacity, and $\Delta C$ represents the capacity change threshold.

The process of determining the second SOH value in steps S601 to S602 may be substantially the same as the implementation process of determining the target SOH value in steps S301 to S302. Therefore, reference may be made to the process of determining the target SOH value in steps S301 to S302 for the specific implementation process of determining the second SOH value in steps S601 to S602, which shall not be repeatedly described herein.

Next, the SOH estimation method of the battery pack provided in the embodiment of the disclosure will be described based on the example of a battery pack in which the rated capacity is 100 Ah, the current resting time at a normal temperature (e.g., 25° C.) is 1 h, and the current measured open circuit voltage $OCV_0$ corresponding to the current initial power-on time is 3563 mV, the battery pack is charged until the cell voltage reaches a full charge state of 4250 mV, the corresponding total charge capacity from completion of the first charge to completion of the current charge is Ctotal=5000 Ah, $\Delta C$=1000, and M=21.

The SOH estimation method of the battery pack provided in the embodiment of the disclosure may include the following steps.

(1) The current resting time t=1 h, the current battery temperature Tmin0=25° C., and the current measured open circuit voltage $OCV_0$=3563 mV corresponding to the current initial power-on time of the battery pack are measured and obtained.

(2) It is determined whether the current resting time t=1 h corresponding to the current initial power-on time is greater than the resting time feature value $\Delta t1$=30 min.

(3) Since t>$\Delta t1$, then according to the current resting time t=1 h, the current battery temperature Tmin0=25° C., and the relational expressions $OCV(t)_{-1}=a_{-1} \log(t)+b_{-1}t+c_{-1}, \ldots,$ $OCV(t)_{-21}=a_{-21} \log(t)+b_{-21}t+c_{-21}$ of the open circuit voltages corresponding to the $1^{st}$ to $21^{st}$ SOC values at the predetermined battery temperature Tmin1 (e.g., 25° C.), the corresponding open circuit voltage $OCV(t)_{-1}$ when the SOC value is 0, the corresponding open circuit voltage $OCV(t)_{-2}$ when the SOC value is 5%, the corresponding open circuit voltage $OCV(t)_{-3}$ when the SOC value is 10%, the corresponding open circuit voltage $OCV(t)_{-4}$ when the SOC value is 15%, and the corresponding open circuit voltage $OCV(t)_{-5}$ when the SOC value is 20% at the current battery temperature Tmin0=25° C. can be determined. The rest can be determined in the same manner and will not be repeatedly described herein.

(4) From among the determined open circuit voltages $OCV(t)_{-1}$ to $OCV(t)_{-21}$ corresponding to the 21 SOC values at the current battery temperature Tmin0=25° C., the current maximum value OCVmax and the current minimum value OCVmin are determined. The current maximum value OCVmax is the maximum value among the values of $OCV(t)_{-1}$ to $OCV(t)_{-21}$ that are less than $OCV_0$, and the current minimum value OCVmin is the minimum value among the values of $OCV(t)_{-1}$ to $OCV(t)_{-21}$ that are greater than $OCV_0$. For example, $OCV(t)_{-4}$ is the current maximum value OCVmax, and $OCV(t)_{-5}$ is the current minimum value OCVmin. Then, it can be determined that $OCV_0$ is in an interval formed by $[OCV(t)_{-4}, OCV(t)_{-5}]$.

For example, the open circuit voltages $OCV(t)_{-4}$ and $OCV(t)_{-5}$ which are closest to $OCV_0$ may be determined from among $OCV(t)_{-1}$ to $OCV(t)_{-21}$ through a bisection method.

(5) According to the open circuit voltage $OCV(t)_{-4}$ and its corresponding SOC value of 15%, and the open circuit voltage $OCV(t)_{-5}$ and its corresponding SOC value of 20%, the specific values of a0 and b0 in the linear relational expression $y_{SOC}=a_0 x_{OCV}+b_0$ may be determined, and the linear relational expression $y_{SOC}=a_0 x_{OCV}+b_0$ may be further obtained.

(6) The current measured open circuit voltage $OCV_0$ is substituted into the linear relational expression $y_{SOC}=a_0 x_{OCV}+b_0$ to obtain the SOC value, i.e., $SOC_0$, corresponding to the current initial power-on time corresponding to the current measured open circuit voltage $OCV_0$. For example, $SOC_0=20\%$.

(7) Since the obtained SOC value of 20% is less than the SOC feature value of 30%, the battery pack may be controlled to charge starting from the current initial power-on time, and the corresponding actual charge capacity Ccharge of 75 Ah of the battery pack from the current initial power-on time to completion of the current charge, and the corresponding current battery temperature $Tcd_{-2}$ of the battery pack upon completion of the current charge are measured and obtained.

(8) According to the obtained current battery temperature $Tcd_{-2}$, the battery temperature-maximum charge capacity matrix table is looked up to obtain the maximum charge capacity $Ccor_{-2}$ corresponding to the current battery temperature $Tcd_{-2}$. For example, $Ccor_{-2}=98$ Ah.

(9) Ccharge=75 Ah, Cor=$Ccor_{-2}=98$ Ah, and $SOC_0=20\%$ are substituted into the relational expression $$SOH_1 = \frac{Ccharge}{Ccor*(100\%-SOC_0)}$$

to obtain the first SOH value of 95.67%, i.e., $SOH_1=95.67\%$.

(10) The corresponding total charge capacity Ctotal=5000 Ah of the battery pack from completion of the first charge to completion of the current charge is determined.

(11) Ctotal=5000 Ah and ΔC=1000 are substituted into the relational expression $$SOH_2 = \left(100 - \frac{Ctotal}{\Delta C}\right)\%$$

to calculate and obtain $SOH_2=95\%$, namely, determining the corresponding second SOH value of the battery pack.

(12) Taking m=0.2 and n=0.8, $SOH_1=95.67\%$ and $SOH_2=95\%$ are substituted into the relational expression $SOH_{000}=m*SOH_1+n*SOH_2$ to calculate and obtain the first intermediate SOH value $SOH_{000}=95.1\%$ of the battery pack.

(13) By using the moving average filtering method, according to the current SOH value $SOH_{000}=95.1\%$, the corresponding target SOH value of the battery pack upon completion of the current charge after filtering is determined.

Specifically, if the $SOH_{000}$ calculated and obtained based on the relational expression satisfied by the $SOH_{000}$ after the previous charging process is 96%, and if the difference between the calculation result $SOH_{000}$ this time and the previous calculation result $SOH_{000}$ is less than a determined threshold of 3%, then the calculation result $SOH_{000}$ this time is valid. It is assumed that a data queue A retains the calculation results $SOH_{000}$ of 10 valid charging processes. For example, the corresponding data queue upon completion of the previous charge is A={100%; 100%; 99%; 99%; 98%; 97%; 97%; 97%; 96%; 96%}. By using the moving average filtering algorithm, the result $SOH_{000}=95.1\%$ this time is stored in the data queue to obtain a new data queue A'={100%; 99%; 99%; 98%; 97%; 97%; 97%; 96%; 96%; 95.1%}. Afterwards, the data queue A' is averaged to obtain the target SOH value of 97.41%, and 97.41% is used to replace the original target SOH value of 97.9% for display.

In summary of the above, in the SOC estimation method of the battery pack provided in the embodiment of the disclosure, the current resting time, the current battery temperature, and the current measured open circuit voltage corresponding to the current initial power-on time of the battery pack are first obtained, and then according to the obtained current resting time, current battery temperature, and current measured open circuit voltage, and the relational expression between the open circuit voltage, the resting time, the battery temperature, and the SOC value at the predetermined different battery temperatures, the SOC value corresponding to the current initial power-on time can be determined, so that the SOC value corresponding to the current initial power-on time can be estimated, and the battery pack can thereby be characterized according to the obtained SOC value.

Moreover, in the SOH estimation method of the battery pack provided in the embodiment of the disclosure, first, the SOC value corresponding to the current initial power-on time is calculated, then the battery pack is controlled to charge starting from the current initial power-on time, and the corresponding actual charge capacity of the battery pack from the current initial power-on time to completion of the current charge, and the corresponding current battery temperature of the battery pack upon completion of the current charge are determined. Therefore, the actual charge capacity and the current battery temperature that are obtained can be accurate. In addition, according to the current battery temperature and the pre-stored correspondence between the battery temperature and the maximum charge capacity of the battery pack upon completion of the current charge, the maximum charge capacity corresponding to the current battery temperature is determined. Afterwards, the target SOH value of the SOH of the battery pack can be determined according to the actual charge capacity, the maximum charge capacity corresponding to the current battery temperature, and the determined SOC value corresponding to the current initial power-on time. Accordingly, the obtained target SOH value can be accurate, so that the attenuation of the battery pack can be characterized accurately.

In the SOH estimation method of the battery pack provided in the embodiment of the disclosure, the corresponding total charge capacity of the battery pack from completion of the first charge to completion of the current charge may be determined by accumulating the charge capacity of each charge. Afterwards, the target SOH value may be determined according to the total charge capacity and the predetermined capacity change threshold to characterize the influence of the cyclic charge of the battery pack on its attenuation.

In the SOH estimation method of the battery pack provided in the embodiment of the disclosure, the corresponding first SOH value of the battery pack from the current initial power-on time to completion of the current charge is determined, the corresponding second SOH value of the battery pack from completion of the first charge to completion of the current charge is determined, and then according to the first SOH value and the second SOH value, the corresponding target SOH value of the battery pack can be determined, so that the attenuation of the battery pack can be characterized by the target SOH value.

Obviously, those skilled in the art may make various modifications and variations to the disclosure without departing from the spirit and scope of the disclosure. Accordingly, if these modifications and variations to the disclosure fall within the scope of the claims of the disclosure and their equivalent techniques, the disclosure is also intended to cover these modifications and variations.

Other embodiments of the disclosure will be apparent to those skilled in the art from consideration of the specification and practice of the disclosure disclosed herein. The disclosure is intended to cover any variations, uses or adaptations of the disclosure. These variations, uses, or adaptations follow the general principles of the disclosure and include common general knowledge or conventional technical means in the art that are not disclosed in the present disclosure. The specification and embodiments are illustrative, and the real scope and spirit of the present disclosure is defined by the appended claims.

It should be understood that the disclosure is not limited to the precise structures that have been described above and shown in the drawings, and various modifications and variations can be made without departing from the scope thereof. The scope of the disclosure is limited only by the appended claims.

What is claimed is:

1. A state-of-charge (SOC) estimation method of a battery pack, comprising:
    obtaining a current resting time, a current battery temperature, and a current measured open circuit voltage corresponding to a current initial power-on time of the battery pack; and
    determining an SOC value corresponding to the current initial power-on time according to the current resting time, the current battery temperature, the current measured open circuit voltage, and a relational expression between an open circuit voltage, a resting time, a battery temperature, and an SOC value at predetermined different battery temperatures;
    wherein the step of determining the SOC value corresponding to the current initial power-on time comprises:
    determining an open circuit voltage closest to the current measured open circuit voltage according to the current resting time, the current battery temperature, and a relational expression of open circuit voltages corresponding to multiple different SOC values at the predetermined different battery temperatures; and
    determining the SOC value corresponding to the current initial power-on time according to the determined open circuit voltage closest to the current measured open circuit voltage and its corresponding SOC value.

2. The SOC estimation method of the battery pack according to claim 1, wherein the step of determining the open circuit voltage closest to the current measured open circuit voltage comprises:
    determining the open circuit voltages corresponding to the multiple different SOC values at the current battery temperature according to the current resting time, the current battery temperature, and the relational expression of the open circuit voltages corresponding to the multiple different SOC values at the predetermined different battery temperatures;
    determining a current maximum value and a current minimum value from among the determined open circuit voltages corresponding to the multiple different SOC values at the current battery temperature, wherein the current maximum value is a maximum value among the open circuit voltages corresponding to the multiple different SOC values that are less than the current measured open circuit voltage, and the current minimum value is a minimum value among the open circuit voltages corresponding to the multiple different SOC values that are greater than the current measured open circuit voltage; and
    determining the current maximum value and the current minimum value as the open circuit voltage closest to the current measured open circuit voltage, and
    the step of determining the SOC value corresponding to the current initial power-on time comprises:
    determining a linear relational expression according to the current maximum value and its corresponding SOC value, and the current minimum value and its corresponding SOC value; and
    determining the SOC value corresponding to the current initial power-on time according to the linear relational expression and the current measured open circuit voltage.

3. The SOC estimation method of the battery pack according to claim 2, wherein a relational expression of an open circuit voltage corresponding to an $m^{th}$ SOC value in the relational expression of the open circuit voltages corresponding to the multiple different SOC values is as follows:

$$OCV(t)_{-m} = a_{-m} \log(t) + b_{-m} t + c_{-m}$$

wherein $a_{-m}$, $b_{-m}$, and $c_{-m}$ represent constant coefficients, t represents the resting time, and $OCV(t)_{-m}$ represents the open circuit voltage corresponding to the $m^{th}$ SOC value at the resting time t.

4. The SOC estimation method of the battery pack according to claim 3, wherein the step of determining the relational expression of the open circuit voltage corresponding to the $m^{th}$ SOC value comprises:

selecting a battery cell sample;
obtaining open circuit voltages and SOC values of the battery cell sample at different battery temperatures within different resting times of the battery cell sample; and
fitting the open circuit voltages and the SOC values of the battery cell sample obtained within the different resting times using a least square method to determine the relational expression of the open circuit voltage corresponding to the $m^{th}$ SOC value.

5. The SOC estimation method of the battery pack according to claim 1, wherein a relational expression of an open circuit voltage corresponding to an $m^{th}$ SOC value in the relational expression of the open circuit voltages corresponding to the multiple different SOC values is as follows:

$$OCV(t)_{-m} = a_{-m} \log(t) + b_{-m} t + c_{-m}$$

wherein $a_{-m}$, $b_{-m}$, and $c_{-m}$ represent constant coefficients, t represents the resting time, and $OCV(t)_{-m}$ represents the open circuit voltage corresponding to the $m^{th}$ SOC value at the resting time t.

6. The SOC estimation method of the battery pack according to claim 5, wherein the step of determining the relational expression of the open circuit voltage corresponding to the $m^{th}$ SOC value comprises:
selecting a battery cell sample;
obtaining open circuit voltages and SOC values of the battery cell sample at different battery temperatures within different resting times of the battery cell sample; and
fitting the open circuit voltages and the SOC values of the battery cell sample obtained within the different resting times using a least square method to determine the relational expression of the open circuit voltage corresponding to the $m^{th}$ SOC value.

7. The SOC estimation method of the battery pack according to claim 2, wherein after obtaining the current resting time, the current battery temperature, and the current measured open circuit voltage of the battery pack corresponding to the current initial power-on time, and before determining the open circuit voltages corresponding to the multiple different SOC values at the current battery temperature, the method further comprises:
determining whether the current resting time corresponding to the current initial power-on time is greater than a resting time feature value, and
the step of determining the open circuit voltages corresponding to the multiple different SOC values at the current battery temperature comprises:
determining the open circuit voltages corresponding to the multiple different SOC values at the current battery temperature when it is determined that the current resting time corresponding to the current initial power-on time is greater than the resting time feature value.

8. The SOC estimation method of the battery pack according to claim 1, wherein the current battery temperature is a minimum value among current battery temperatures corresponding to each battery cell in the battery pack.

9. The SOC estimation method of the battery pack according to claim 1, wherein the current battery temperature is a minimum value among current battery temperatures corresponding to each battery cells in the battery pack.

10. The SOC estimation method of the battery pack according to claim 2, wherein the current battery temperature is a minimum value among current battery temperatures corresponding to each battery cells in the battery pack.

11. A state-of-health (SOH) estimation method of a battery pack, comprising:
obtaining a current resting time, a current battery temperature, and a current measured open circuit voltage corresponding to a current initial power-on time of the battery pack;
determining an SOC value corresponding to the current initial power-on time according to the current resting time, the current battery temperature, the current measured open circuit voltage, and a relational expression between an open circuit voltage, a resting time, a battery temperature, and an SOC value at predetermined different battery temperatures;
controlling the battery pack to charge starting from the current initial power-on time, and obtaining a corresponding actual charge capacity of the battery pack from the current initial power-on time to completion of a current charge, and a corresponding current battery temperature of the battery pack upon completion of the current charge;
determining a maximum charge capacity corresponding to the current battery temperature according to the current battery temperature and a pre-stored correspondence between the battery temperature and the maximum charge capacity of the battery pack upon completion of the current charge; and
determining a target SOH value of an SOH of the battery pack according to the actual charge capacity, the maximum charge capacity corresponding to the current battery temperature, and the determined SOC value corresponding to the current initial power-on time.

12. The SOH estimation method of the battery pack according to claim 11, wherein a relational expression below is adopted to determine the target SOH value of the SOH of the battery pack:

$$SOH_0 = \frac{Ccharge}{Ccor * (100\% - SOC_0)}$$

wherein $SOH_0$ represents the target SOH value of the SOH of the battery pack, Ccharge represents the actual charge capacity, Ccor represents the maximum charge capacity corresponding to the current battery temperature, and $SOC_0$ represents the determined SOC value corresponding to the current initial power-on time.

13. The SOH estimation method of the battery pack according to claim 11, wherein after determining the SOC value corresponding to the current initial power-on time, and before controlling the battery pack to charge starting from the current initial power-on time, the method further comprises:
determining whether the SOC value is less than an SOC feature value, and
the step of controlling the battery pack to charge starting from the current initial power-on time comprises:
controlling the battery pack to charge starting from the current initial power-on time when it is determined that the SOC value is less than the SOC feature value.

* * * * *